(12) United States Patent
Desko et al.

(10) Patent No.: US 6,372,600 B1
(45) Date of Patent: Apr. 16, 2002

(54) ETCH STOPS AND ALIGNMENT MARKS FOR BONDED WAFERS

(75) Inventors: John Charles Desko, Wescosville; Muhammed Ayman Shibib, Wyomissing, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/385,735

(22) Filed: Aug. 30, 1999

(51) Int. Cl.[7] .............................................. H01L 21/76
(52) U.S. Cl. .................. 438/406; 438/691; 438/692; 156/626
(58) Field of Search ................... 438/406, 424, 438/427, 691, 692; 156/626

(56) References Cited

U.S. PATENT DOCUMENTS

| | | | |
|---|---|---|---|
| 5,091,330 A | * 2/1992 | Cambou et al. | 438/406 |
| 5,258,318 A | * 11/1993 | Buti et al. | 438/406 |
| 5,308,776 A | * 5/1994 | Gotou | 438/406 |
| 5,413,941 A | * 5/1995 | Koos et al. | 156/626 |
| 5,439,551 A | * 8/1995 | Meikle et al. | 156/626.1 |
| 5,459,104 A | * 10/1995 | Sakai | 438/406 |
| 5,484,738 A | * 1/1996 | Chu et al. | 438/406 |
| 5,504,033 A | * 4/1996 | Bajor et al. | 438/424 |
| 5,536,675 A | * 7/1996 | Bohr | 438/427 |
| 5,683,932 A | * 11/1997 | Bashir et al. | 438/427 |
| 5,728,621 A | * 3/1998 | Zheng et al. | 438/424 |
| 5,872,043 A | * 2/1999 | Chen | 438/424 |
| 2001/0000497 A1 | * 4/2001 | Epshteyn et al. | 438/691 |

FOREIGN PATENT DOCUMENTS

| | | | | |
|---|---|---|---|---|
| EP | 000623423 A1 | * | 9/1994 | B24B/37/14 |
| JP | 10-264017 | * | 10/1998 | B24B/37/04 |
| JP | 11 58225 | * | 3/1999 | H01L/21/304 |
| JP | 11 77517 | * | 3/1999 | H01L/21/304 |

OTHER PUBLICATIONS

Patent No. 4312732, filed on Mar. 10, 1980 and issued on Jan. 26, 1982 to Degenkolb et al.

* cited by examiner

*Primary Examiner*—Charles Bowers
*Assistant Examiner*—David S Blum

(57) ABSTRACT

There is described a method of making a bonded wafer by diffusing regions of a first wafer proximate a first major surface. Trenches are etched a predetermined distance into the first wafer from the first major surface toward a second major surface. The first major surface and trenches are coated with oxide. The first major surface of the first wafer is bonded to a second wafer to form a bonded wafer. The second major surface of the bonded wafer which is also the second major surface of the first wafer is ablated until oxide in the trenches is detected. The bonded wafer is cut into chips which are packaged as integrated circuits.

17 Claims, 2 Drawing Sheets

ETCH STOPS AND ALIGNMENT MARKS FOR BONDED WAFERS

TECHNICAL FIELD

This invention relates generally to bonded wafers, and more particularly to a method of manufacturing a bonded wafer, the bonded wafer made by the method, and integrated circuits manufactured from chips on such wafers.

BACKGROUND OF THE INVENTION

Bonded wafers are fabricated with a single crystal substrate wafer bonded to a single crystal silicon device wafer. The substrate wafer provides structural strength to the bonded wafer and is relatively thicker, while the device wafer in which devices are subsequently formed is relatively thinner. A surface of each of the substrate wafer and the device wafer are polished to be planar. The polished surfaces are placed in contact with each other and the wafers are subjected to a high temperature heat treatment which bonds the wafers together. There may or may not be an oxide layer formed on the substrate wafer, the device wafer, or both of the wafers, prior to bonding. With an oxide layer on at least one of the wafers prior to bonding, the oxide layer forms an oxide layer between the substrate wafer and the device wafer when the substrate wafer and device wafer are bonded.

Bonded wafers in which buried layers are required for device fabrication are made by bonding a device wafer to a substrate wafer as described above. Subsequent to being bonded, the device wafer is thinned by removing material from a major exposed surface until the device wafer is thinned to a predetermined thickness, such as 1 to $2\mu$. Buried or diffused layers, of N-type or P-type, or both, are implanted into the device wafer portion of the bonded wafer. An epitaxial layer of N or P type material is grown to the desired thickness over the device wafer portion of the bonded wafer.

Any known technique, including but not limited to plasma etching, ion etching, grinding or polishing, may be used to ablate a surface of the device wafer. When removing material from the major exposed surface of the device wafer portion of the bonded wafer to thin the device wafer to the predetermined thickness, it is difficult to control the thickness of the device wafer portion of the bonded wafer that remains after the thinning process. Furthermore, it is difficult to align subsequent device diffusions with the buried layers in the device wafer portion of the bonded wafer.

What is needed is a technique to precisely control the thickness of the device wafer portion of the bonded wafer when the device wafer is thinned. It is also desirable to have an accurate alignment feature to align subsequent device diffusions with buried layers in the device wafer.

SUMMARY OF THE INVENTION

In accordance with the present invention, a method of making a bonded wafer by diffusing regions of a first wafer, first major surface. Trenches are etched a predetermined distance into the first wafer from the first major surface toward a second major surface. The first major surface and trenches are coated with oxide. The first major surface of the first wafer is bonded to a second wafer to form a bonded wafer. The second major surface of the bonded wafer which is also the second major surface of the first wafer is ablated until oxide in the trenches is detected. The bonded wafer is cut into chips which are packaged as integrated circuits.

DETAILED DESCRIPTION

Figure 1:
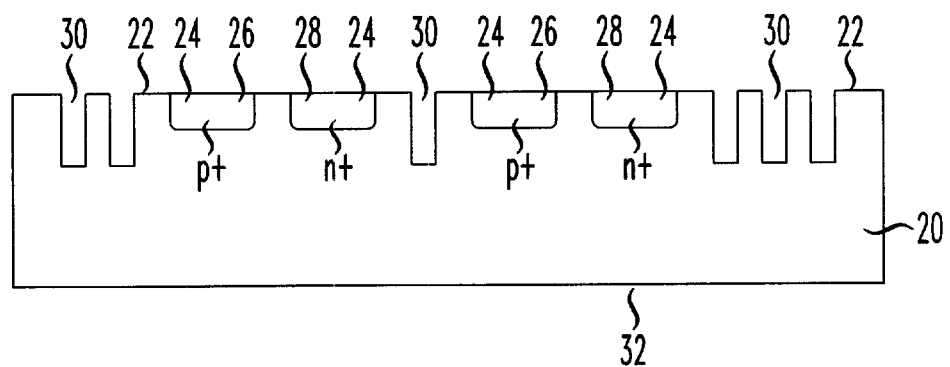
FIG. 1 is a cross section of a device wafer having P and N diffused regions therein.

A cross-section of a device wafer 20 is shown prior to wafer bonding in FIG. 1. The features of device wafer 20, and other wafers illustrated herein, are not to scale; they have been exaggerated for clarity. Device wafer is a cylinder having two major circular surfaces. Device wafer 20 is typically polished on one major surface to form a planar first major surface 22. As is known in the art, diffused regions 24 are created in selected regions of device wafer 20 such as by implanting an impurity and diffusing the impurity. Diffused region 24 may be positive diffused region 26 or negative diffused region 28. Trenches 30 are etched in device wafer 20 from first major surface 22 and extend toward second major surface 32. Second major surface 32 is substantially parallel to first major surface 22. Trenches 30 are etched in device wafer 20 from first major surface 22 to a predetermined depth, such as d, which is less than the thickness, t, of device wafer 20. Trenches 30 are etched using a well-known, well-controlled process, such as but not limited to active ion etching or plasma etching.

Figure 2:
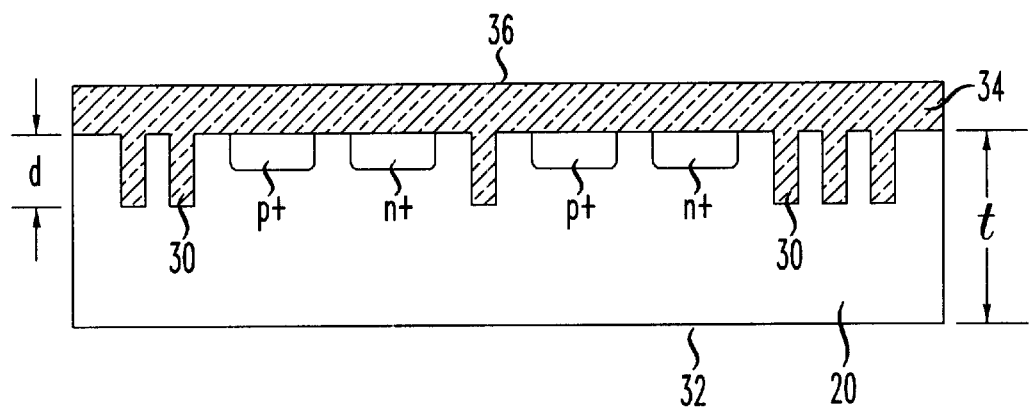
FIG. 2 is a cross section of the device wafer of FIG. 1 having an oxide layer grown or deposited thereon.
Figure 3:
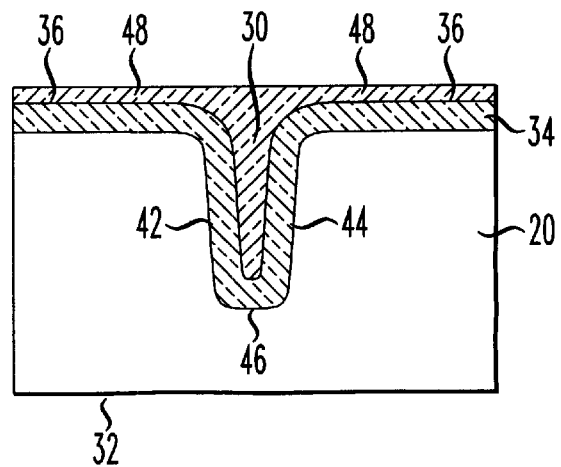
FIG. 3 is a cross section of a trench.

As shown in FIG. 2, an oxide layer 34 is deposited on or grown on first major surface 22, forming an alternative first major surface 36. Trenches 30 will be partially or completely filled with oxide by this process step. FIG. 3 illustrates partial filling of a typical trench 30 in which the inner surface of sidewalls 42 and 44 as well as end 46 are coated with oxide but the trench is not completely filled. To eliminate voids, an additional layer such as a polysilicon layer may be deposited over the layer of oxide. Polysilicon layer 48 fills the remaining cavity in trench 30. Polysilicon layer 48 may be polished and oxidized to form a planar, bondable surface. Whether an oxide is grown on first major surface 22 or an oxide is deposited, or a combination of these steps, an alternative first major surface, either 36 or 48, is produced and is substantially planar. Hereinafter, the alternative first major surface will be referenced by reference numeral 36, although it is understood that it may be either surface 36 or surface 48.

Ideally a cross section of trenches 30 have parallel sidewalls 42 and 44 and a flat end 46. The cross-section of an ideal trench forms a rectangular shape. However, in practice sidewalls 42 and 44 tend to taper toward each other slightly from first major surface 22 extending toward second major surface 32 and end 46 of trench 30. End 46 may be slightly rounded with a rounded intersection between each of sidewalls 42 and 44 and end 46, as shown in FIG. 3.

Figure 4:
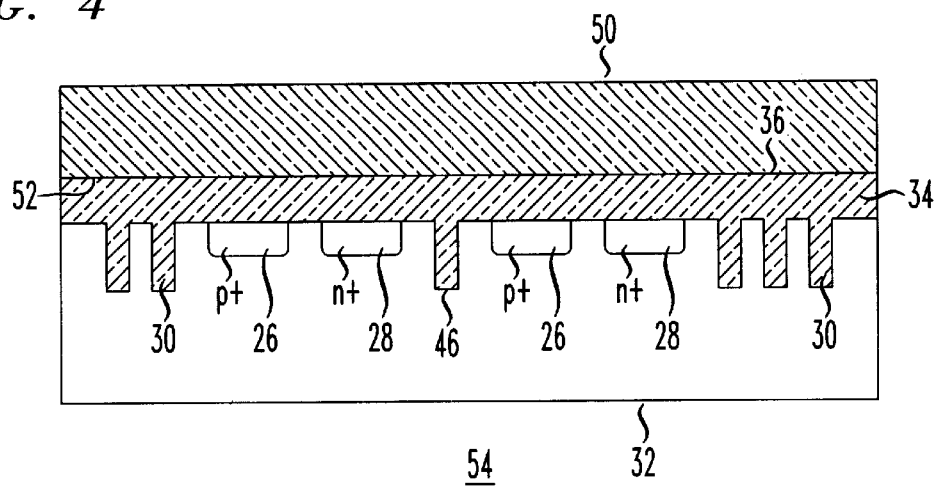
FIG. 4 is a cross section of a bonded wafer in accordance with the present invention.

Substrate wafer 50 having substantially planar major surface 52 is placed in contact with alternative first major surface 36, or alternative first major surface 48 when present. Device wafer 20 and substrate wafer 50 are subjected to a high-temperature heat treatment, as is known in the art, to bond the wafers together forming bonded wafer 54 illustrated in FIG. 4.

In the structure of bonded wafer 54, the diffused regions 24 and trenches 30 are internal to bonded wafer 54. Trenches 30 extend toward one of the outer major surfaces of bonded wafer 54, which is also the second major surface 32 of device wafer 20.

Prior to further processing to create bipolar or double-diffused metal oxide semiconductor devices such as diodes and transistors, second major surface 32 is ablated by a known process. Any known ablating process may be used, including but not limited to, chemical mechanical polishing, polishing, grinding or etching. The major surface 32 at any stage of the ablating process will be referred to as major surface 60. The ablating process thins bonded wafer 54, and more specifically device wafer 20 to a predetermined thickness.

Device wafer 20 is thinned by ablating major surface 60 until the remaining thickness of device wafer 20 is a predetermined thickness. Ends 46 act as stops to the ablating process. In accordance with the present invention, the ablating process is stopped when the end 46 of trenches 30 begin to be ablated. This may be detected such as by observing a characteristic such as but not limited to opacity of a grinding solution, or optically in accordance with U.S. Pat. No. , 4,312,732, the disclosure of which is hereby incorporated by reference.

By employing trenches 30 to indicate when the ablating process should cease, and knowing that the trenches were created in a very controlled process such that the distance of end 46 from first major surface 22 is known, the remaining thickness of device wafer 20 between ablated major surface 60 and first major surface 22 is also known. The remaining predetermined thickness by device wafer 20 is selected so that subsequent implants from major surface 60 provides proper depth placement of implanted regions relative to diffused regions 24. Typically, the device wafer is thinned to a predetermined thickness, such as 1 to 2 micrometers, which is critical for device characteristics and performance.

Figure 5:
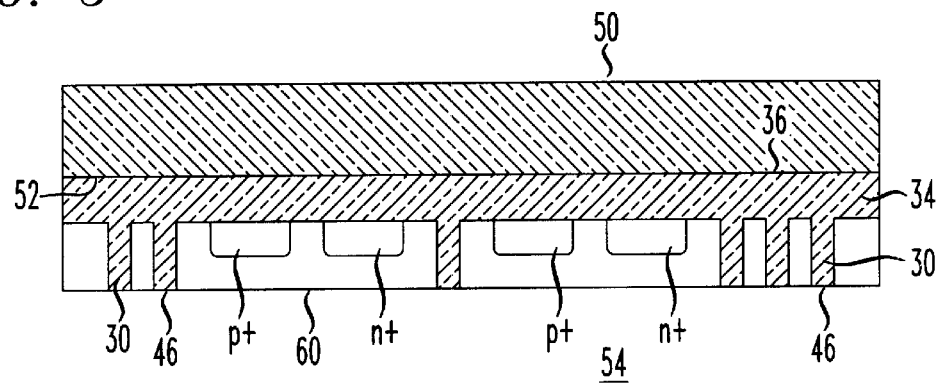
FIG. 5 is a cross section of the bonded wafer of FIG. 4 subsequent to thinning.
Figure 6:
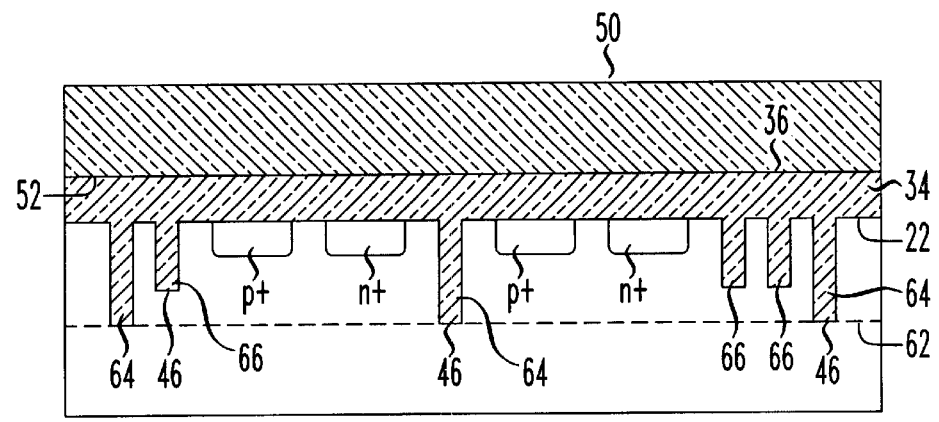
FIG. 6 is a cross section of an alternative embodiment bonded wafer in accordance with the present invention.

In one embodiment, all of trenches 30 are etched in device wafer 20 to a predetermined depth as shown in FIG. 5. In an alternative embodiment as shown in FIG. 6, trenches 30 may be etched to various predetermined depths into device wafer 20. More than one etching step may be required. One or more trenches or sets of trenches may be etched to various depths such that when the ablating process is reducing the thickness of device wafer 20 by ablating major surface 60, the process may be stopped and evaluated for the remaining distance to be ablated based on the predetermined depth of the various trenches 30. One or more trenches may be used to indicate the desired thickness has been reached, or has been passed. For example ends 46 of trenches 64 denote the desired thicknesses of device wafer 20, such that the ablating process should be terminated when surface 60 is coincident with broken line 62. Trenches 66 may not be as deep as trenches 64, as illustrated in FIG. 6. Should the ablating process continue until ends 46 of trenches 66 are exposed, device wafer 20 has been thinned too much.

The trenches may be placed, for example, in areas of the wafer in which devices will not be formed. The area density of the trenches may range from about 2% to about 15% of the area of a major surface of device wafer 20. The area density of the trenches can be controlled by placement of trenches in saw-grid area and other otherwise unused areas of the wafer to match control conditions to stop the ablating process.

All trenches may have the same width between sidewalls 42 and 44, although the invention is not limited thereto. Trenches may vary in width. One advantage of trenches of uniform width is that the trenches would be filled with oxide more consistently than trenches of varying width.

A major surface 60 has been ablated using the thickness of device wafer 20 at its predetermined depth, sidewalls 42 and 44 may be detected by separate equipment used to align subsequent implantation over the diffused regions 24 more precisely than could be achieved in the past. With device wafer 20 thinned to the desired thickness as described above, the subsequent device level masking step can use the trenches as alignment marks to obtain improved alignment between the device level implants and the buried diffused regions 24. Alignment may rely for example on a sidewall 42 or 44. The more precise alignment assures that doping in a subsequent processing step is placed in the proximity of buried diffused regions 24 such that the buried diffused regions 24 can interact with doped regions created in the subsequent processing step. By more precisely positioning implantations over the diffused region 24, tolerances are tightened, a smaller area is required to fabricate each device in bonded wafer 54, and concomitantly more devices can be fabricated per unit area of a major surface of bonded wafer 54. After completion of processing, bonded wafer 54 is cut into chips. Chips are wire bonded and packaged as integrated circuits as is known in the art.

While the invention has been described with respect to a silicon substrate wafer and a silicon device wafer being formed into a bonded wafer, the invention is not limited to being used with silicon. The substrate wafer could be made of other materials known in the art including but not limited to polysilicon or silicon carbide. The device wafer could be made of other semiconductor materials known in the art including but not limited to indium phosphide, gallium arsenide, indium gallium phosphide and silicon carbide.

What is claimed is:

1. A method of making a bonded wafer, comprising the steps of:

diffusing regions of a first wafer proximate a first major surface;

etching trenches a distance into the first wafer from the first major surface toward a second major surface;

coating the first major surface and trenches with oxide;

bonding the first major surface of the first wafer to a second wafer to form the bonded wafer; and ablating the second major surface until oxide in the trenches is detected, the ablating being performed by detecting an opacity of an ablating solution used for ablating the second major surface.

2. The method as recited in claim 1, further comprising the step of applying a layer of polysilicon over the oxide.

3. The method as recited in claim 1, wherein the step of etching trenches further comprises the step of:

etching a first set of trenches a first depth into the first wafer from the first major surface toward the second major surface; and etching a second set of trenches a second depth into the first wafer from the first major surface toward the second major surface, the second depth differing from the first depth.

4. The method as recited in claim 1, wherein the coating step comprises:

growing an oxide.

5. The method as recited in claim 1, wherein the coating step comprises:

depositing an oxide.

6. The method as recited in claim 1, wherein the bonding step comprises:

placing major surfaces of the first and second wafers in contact with each other; and subjecting the first and second wafers to a high temperature.

7. The method as recited in claim 1, wherein the step of ablating comprises:

ablating the second major surface to thin the first wafer to a thickness.

8. The method as recited in claim 1, wherein the step of ablating comprises;

polishing the second major surface.

9. The method as recited in claim 1, wherein the step of ablating comprises;

etching the second major surface.

10. The method as recited in claim 1, further comprising the step of aligning a subsequent processing step relative to a trench.

11. The method as recited in claim 10, wherein the aligning step comprises aligning a subsequent processing step relative to an edge of a trench.

12. The method as recited in claim 1, further comprising the step of cutting the bonded wafer into chips.

13. The method of claim 1, wherein the step of etching trenches comprises etching the trenches in a saw-grid area of the bonded wafer.

14. The method of claim 1, wherein the step of etching trenches comprises etching the trenches in an area of the bonded wafer in which no devices are formed.

15. The method of claim 1, wherein the step of etching trenches comprises etching the trenches to have an area density in a range of about 2 percent to about 15 percent.

16. The method of claim 1, wherein the trenches etched into the first wafer are formed having a substantially uniform width with respect to each other.

17. A method of making a bonded wafer, comprising the steps of:

diffusing regions of a first wafer proximate a first major surface;

etching trenches a predetermined distance into the first wafer from the first major surface toward a second major surface;

coating the first major surface and trenches with oxide;

bonding the first major surface of the first wafer to a second wafer to form the bonded wafer; and ablating the second major surface by detecting a characteristic representative of when an end of the trenches begins being ablated and stopping the ablating in response to a presence of the detected characteristic, the detected characteristic being an opacity of an ablating solution used for ablating the second major surface.

* * * * *